(12) United States Patent
Bogin et al.

(10) Patent No.: US 6,173,217 B1
(45) Date of Patent: *Jan. 9, 2001

(54) METHOD AND APPARATUS TO CONTROL CORE LOGIC TEMPERATURE

(75) Inventors: Zohar Bogin, Folsom; Vincent E. VonBokern, Rescue, both of CA (US)

(73) Assignee: Intel Corporation, Santa Clara, CA (US)

(*) Notice: Under 35 U.S.C. 154(b), the term of this patent shall be extended for 0 days.

This patent is subject to a terminal disclaimer.

(21) Appl. No.: 08/990,711

(22) Filed: Dec. 15, 1997

Related U.S. Application Data

(63) Continuation-in-part of application No. 08/979,835, filed on Nov. 26, 1997, now Pat. No. 5,953,685.

(51) Int. Cl.[7] .................................................. G05D 23/00
(52) U.S. Cl. ........................ 700/299; 700/153; 702/130
(58) Field of Search ........................... 700/299, 71, 153, 700/202, 205, 204; 702/130, 136

(56) References Cited

U.S. PATENT DOCUMENTS

| | | | |
|---|---|---|---|
| 5,265,099 | * 11/1993 | Feinstein | 714/718 |
| 5,590,061 | * 12/1996 | Hollowell, II et al. | 702/130 |
| 5,721,837 | 2/1998 | Kikinis et al. | 710/101 |
| 5,732,215 | 3/1998 | Boutaghou et al. | 710/44 |
| 5,784,328 | 7/1998 | Irrinki et al. | 365/222 |
| 5,798,918 | 8/1998 | Georgiou et al. | 364/148 |
| 5,835,885 | 11/1998 | Lin | 702/99 |
| 5,953,685 | * 9/1999 | Bogin et al. | 702/136 |

* cited by examiner

Primary Examiner—William Grant
Assistant Examiner—Kidest Bahta
(74) Attorney, Agent, or Firm—Blakely, Sokoloff, Taylor & Zafman LLP

(57) ABSTRACT

A method for controlling core logic temperature. The core logic having a memory controller and memory components coupled to system memory. The method having the step of determining access rate to the system memory through the core logic and controlling the temperature of the core logic by adjusting the access rate.

58 Claims, 9 Drawing Sheets

METHOD AND APPARATUS TO CONTROL CORE LOGIC TEMPERATURE

CROSS-REFERENCE TO RELATED APPLICATIONS

This is a continuation-in-part of U.S. Patent application No. 08/979,835 filed Nov. 26, 1997, which issued into U.S. Pat. No. 5,953,685 on Sep. 14, 1999.

BACKGROUND OF THE INVENTION

(1) Field of the Invention

The field of the invention is the temperature control of computer components; more specifically, the present invention is related to a method and apparatus for controlling the temperature of core logic components including a memory controller.

(2) Related Art

Each computer system component typically has a corresponding thermal specification which defines the maximum temperature at which a component will likely break down or slow down to cause system failure.

In the prior art approach, device die temperature is measured in terms of voltage variations that reflect temperature changes. The voltage levels are converted to a digital signal that is compared to a pre-determined threshold. When the threshold is exceeded, an interrupt signal is generated to the central processing unit (CPU) which handles the high temperature condition in software.

Many disadvantages are inherent in the prior art approach. For example, the prior art approach is expensive as it requires analog circuitry which requires a high amount of tuning to provide accurate and reliable temperature signals. Further, handling the complexity of analog circuitry requires a long product development period. Finally, the prior art approach utilizes hardware to directly detect the thermal condition but relies on software to actually prevent the thermal violation. The prior approach is therefore exposed to security violations by, for example, virus programs.

It is therefore desirable to have a mechanism which overcomes the above stated disadvantages of the prior art approach and provides a less expensive, easier to calibrate alternative to controlling the temperature of core logic components.

BRIEF SUMMARY OF THE INVENTION

A method for controlling component temperature. The method determines the access rate to the component and controls the temperature of the component by adjusting the access rate.

DETAILED DESCRIPTION OF THE INVENTION

The present invention provides a method and apparatus for controlling core logic temperature. In one embodiment, core logic as referred herein denotes a memory controller of a computer system.

The present invention monitors and controls memory access rate between a core logic and memory components (e.g., synchronous dynamic random access memory (SDRAM)) such that power dissipation and therefore thermal specification of the core logic is met. Thermal specification as referred herein designates a particular component's tolerance for heat. For example, given a component, its thermal specification describes the approximate temperature at which the component is likely to slow down and/or cause system failures or to break down.

When the access rate causes excessive temperatures, the present invention's throttling function is enabled. The throttling function slows the access rate for a predetermined period of time that is sufficient to guarantee that the component's thermal specification is not exceeded.

The present invention is simple to validate and has negligible effects on component gate count.

Figure 1A:
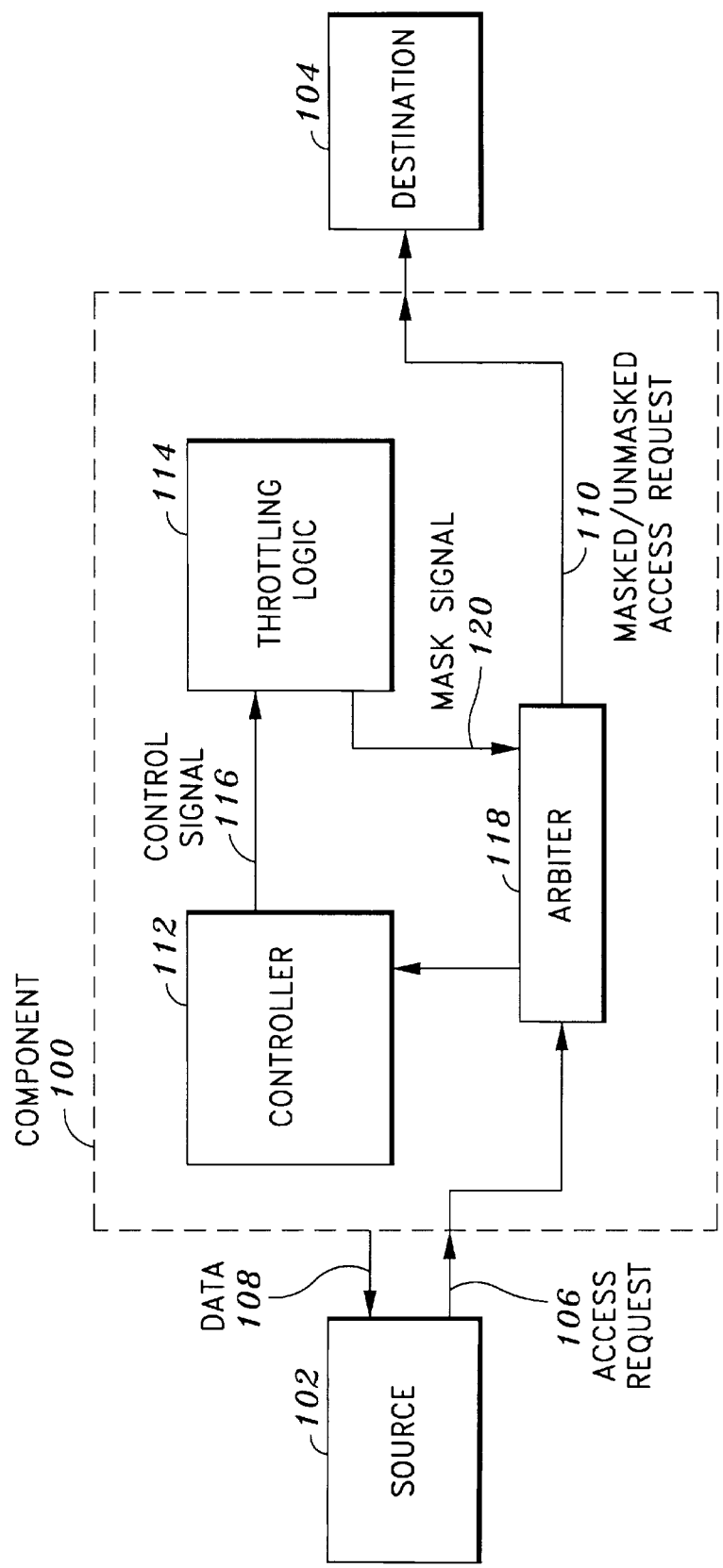
FIG. 1a is an exemplary system block diagram illustrating one embodiment of the present invention in controlling the temperature of a device by controlling the access rate to the device.

FIG. 1a is an exemplary system block diagram illustrating one embodiment of a system in which the temperature of a device is controlled by controlling the access rate to the device in the system. In such a system, the temperature of the system is reduced by reducing the access rate to the device. The access rate may be reduced by reducing the number of accesses to the device. In an alternative embodiment, the access rate may be reduced by reducing the speed at which the accesses occur. Yet in another embodiment, accesses may be reduced by stopping an access that is already being performed. In the system of the present invention, the device temperature is reduced, along with the temperature of other devices whose use is diminished due to the reduction in access rate of the device.

A component 100 controls data access rate to and from other components. In one embodiment, the component 100 controls access rate between a source 102 which generates access requests and a destination 104 to which access requests are made.

In one embodiment, the component 100 may be, but is not limited to, a bridge coupling various devices such as a peripheral device (e.g., a peripheral component interconnect (PCI) device), a graphics device and/or a processor to a memory device allowing data exchange between the devices. The component 100 may also be a controller for a device such as, for instance, a memory device, a graphics device, a peripheral bus device or a processor facilitating transmission of data to and from the device. Although component 100 is shown as one device, component 100 may be multiple devices.

The source 102 may be, but is not limited to, a data read/write requester which generates data read and/or write requests to the destination 104. The destination 104 may be, but is not limited to, a memory device or any data source or data sink (e.g., network, processing device, storage device, etc.).

In FIG. 1a, the component 100 has a controller 112 configured to monitor access request 106 which has been processed and notify a throttling logic 114 of the processed access requests through a control signal 116. The throttling logic 114 begins throttling the access requests if the number of processed access requests is equal to or greater than a predetermined threshold. In one embodiment, the throttling logic begins generating a mask signal for each access request 106 when the number of processed access requests is equal to or greater than a threshold. The mask signal is then input to an arbiter 118 which masks access requests 106.

Thus, by controlling the access rate to the component and the destination, the component controls the temperature of the system and thermal violations are prevented.

Figure 1B:
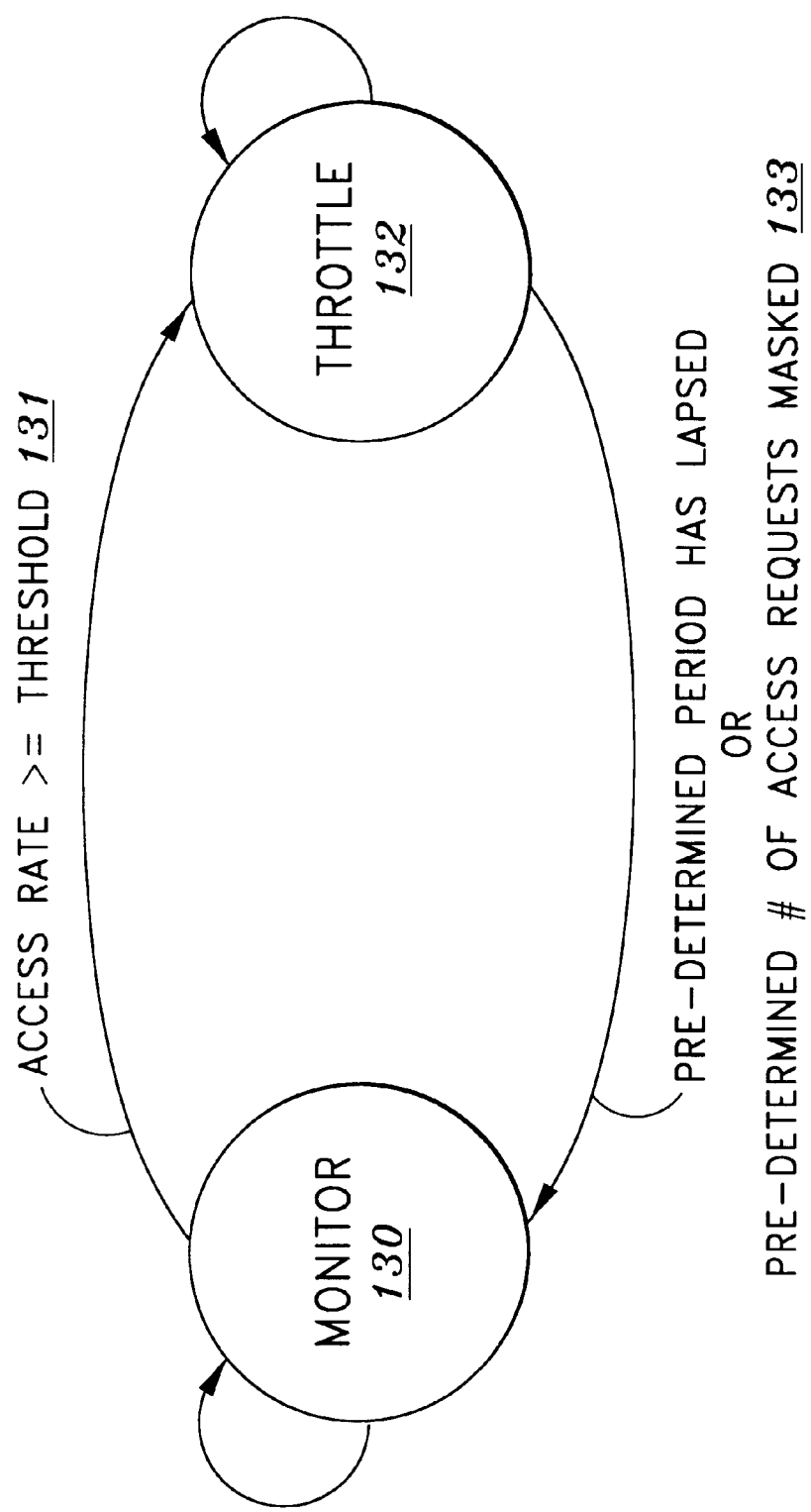
FIG. 1b is a state diagram illustrating one embodiment of the throttling logic of the present invention.

FIG. 1b is a state diagram illustrating one embodiment of the throttling logic of the present invention. The state machine is at a monitor state 130 while the number of processed access requests from a source to a destination is monitored. If the number of processed access requests is equal to or greater than a predetermined threshold (131), the state transitions to a throttle state 132. In an alternative embodiment, if the throttling logic monitors the temperature of the device and determines that the device is approaching and/or is outside its thermal specification, or if the throttling logic receives an indication to that effect, then the state transitions to throttle state 132.

In the throttle state 132, the state machine throttles access requests from the source to the destination until a pre-determined time period has elapsed or in the alternative, a pre-determined number of access requests has been masked. In an alternative embodiment, a pre-determined number of access requests are masked until the temperature reaches a desired level. The state then transitions back to a monitor state 130 and the cycle may be repeated.

Note that the throttling logic may be designed to throttle the device up if it is capable of accommodating more accesses and its temperature is below the specified level. In other words, the access rate to a device may be increased while the device temperature remains within its thermal specification.

Figure 1C:
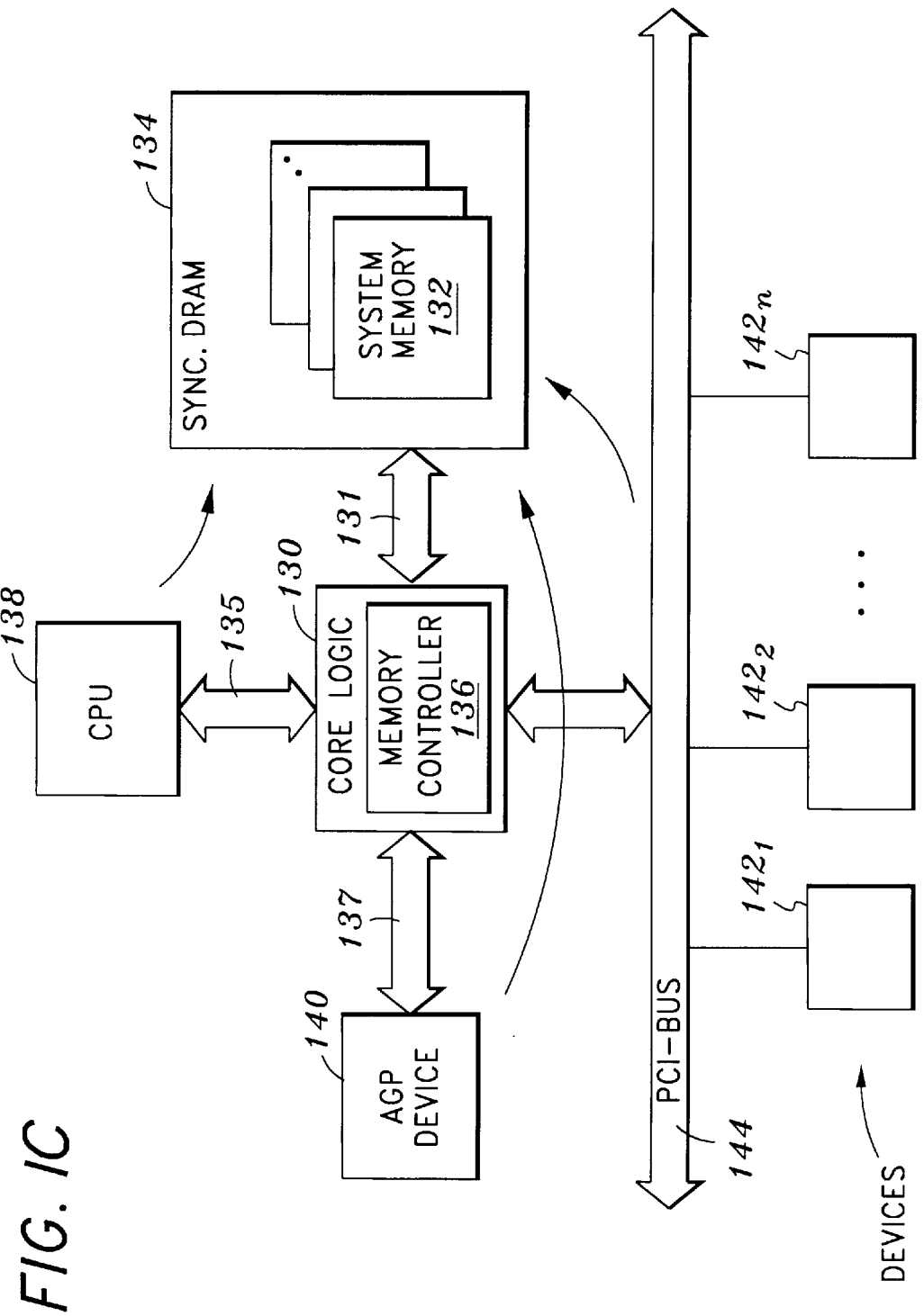
FIG. 1c illustrates an exemplary block diagram of a computer system having a core logic exposed to potential thermal violations.

FIG. 1c illustrates an exemplary block diagram of a computer system having a core logic exposed to potential thermal violations. More specifically, in one embodiment, core logic 130 has a memory controller 136 and is coupled to DRAM's 134 including synchronous DRAM's (SDRAM) and a system memory 132 by bus 131. The memory controller 136 couples the system memory 132 and the SDRAM's 134 to various devices including a central processing unit (CPU) 138 such as an Intel Pentium® II processor coupled by a bus 135, an accelerated graphics port (AGP) device 140 coupled by a bus 137, and a plurality of peripheral component interconnect (PCI) devices $142_1$ through $142_N$ coupled by bus 144. Although not shown, a person skilled in the art may appreciate that the system may also include various other components typically found in a computer system.

The PCI devices $142_1$ through $142_N$ are Input/Output (I/O) hardware devices that are coupled to the system through a PCI expansion connector (not shown) or mounted to the personal computer (PC) motherboard (not shown). Examples of PCI or other I/O devices include, but are not limited to a graphic controller/card, a disk controller/card, a local area network (LAN) controller/card and a video controller/card. The AGP device 140 is coupled to the system memory 132 through the memory controller 136 and is designed to attempt to optimize the graphics data transfer operations in high speed personal computers (PC).

Memory controller 136 provides the CPU 138, the AGP device 140 and the PCI devices $142_1$ through $142_N$ access to the system memory 132. For example, on a data write transaction, a write request as well as the data to be written into system memory are passed to and processed by the memory controller 136. On a read transaction, a read request is passed to the memory controller 136 and the data requested is sent back from the system memory 132 to the requesting components such as the CPU 138, the AGP device 140 and/or the PCI devices $142_1$ through $142_N$.

Because of the high traffic and the high volume of data in read and write requests being processed and driven to the system memory 132 by the memory controller 136, the memory controller 136's power consumption increases causing a direct increase in the temperature of the memory controller 136. If the temperature crosses over a certain thermal threshold as defined by the memory controller 136's temperature specification, the memory controller 136 may break down, slow down and/or cause system failure. Similarly, the thermal specification of the SDRAM's 134 may be violated due to increased temperature on processing a high volume of read requests. The present invention's digital method and apparatus controls the core logic 130 temperature by monitoring data access rate through the memory controller to ensure that such breakdown is prevented.

Although the core logic 130 is illustrated as having a memory controller 136, in another embodiment the core logic 130 may also include a host bridge connecting the system memory to various components such as, for example, the CPU, peripheral interconnect (PCI) devices and the accelerated graphics port (AGP) device. In yet another embodiment, the core logic 130 has one or more bus (e.g., PCI bus) controller, an graphics (e.g., AGP) controller and a CPU controller in addition to the memory controller to control data access between various components such as, for example, bus and graphics devices, the system memory and the CPU.

Figure 2A:
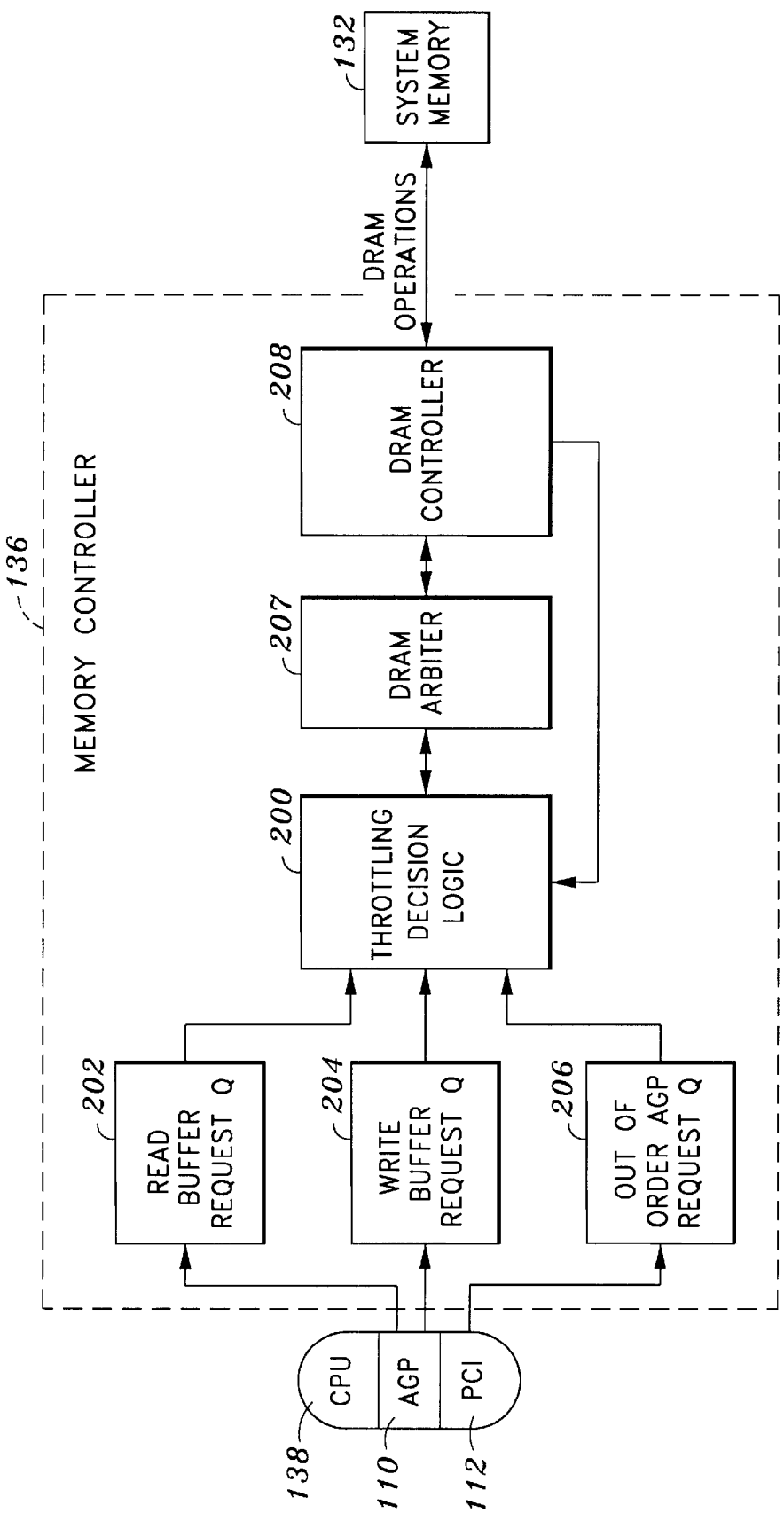
FIG. 2a is a block diagram illustrating one embodiment of a portion of the internal components comprising the memory controller illustrated in FIG. 1.

FIG. 2a is a functional block diagram of one embodiment of a memory controller. A throttling decision logic 200 is coupled to multiple data read and write request/data queues 202, 204 and 206. The throttling decision logic 200 monitors the access rate of data transfer requests to system memory and generates signals limiting the number of data transfer requests processed when the access rate is greater than or equal to a predetermined threshold.

A read request queue 202 contains a plurality of read requests made by various system components. A write buffer request queue 204 contains a plurality of write requests made by various components of the core logic 100. An out of order AGP request queue 206 contains AGP requests made by the AGP device 110.

The throttling decision logic 200 is coupled to a DRAM arbiter 207 which passes on the read/write requests to a DRAM controller 208. The DRAM controller 208 performs DRAM operations, e.g. read and write requests, to the system memory. The DRAM arbiter 207 receives control signals from the throttling decision logic 200 which specifies the timing and the duration that the DRAM arbiter 207 is to hold up the processing of read requests to prevent thermal violations in the SDRAM and to hold up the processing of both read and write requests to prevent thermal violations in the memory controller.

Figure 2B:
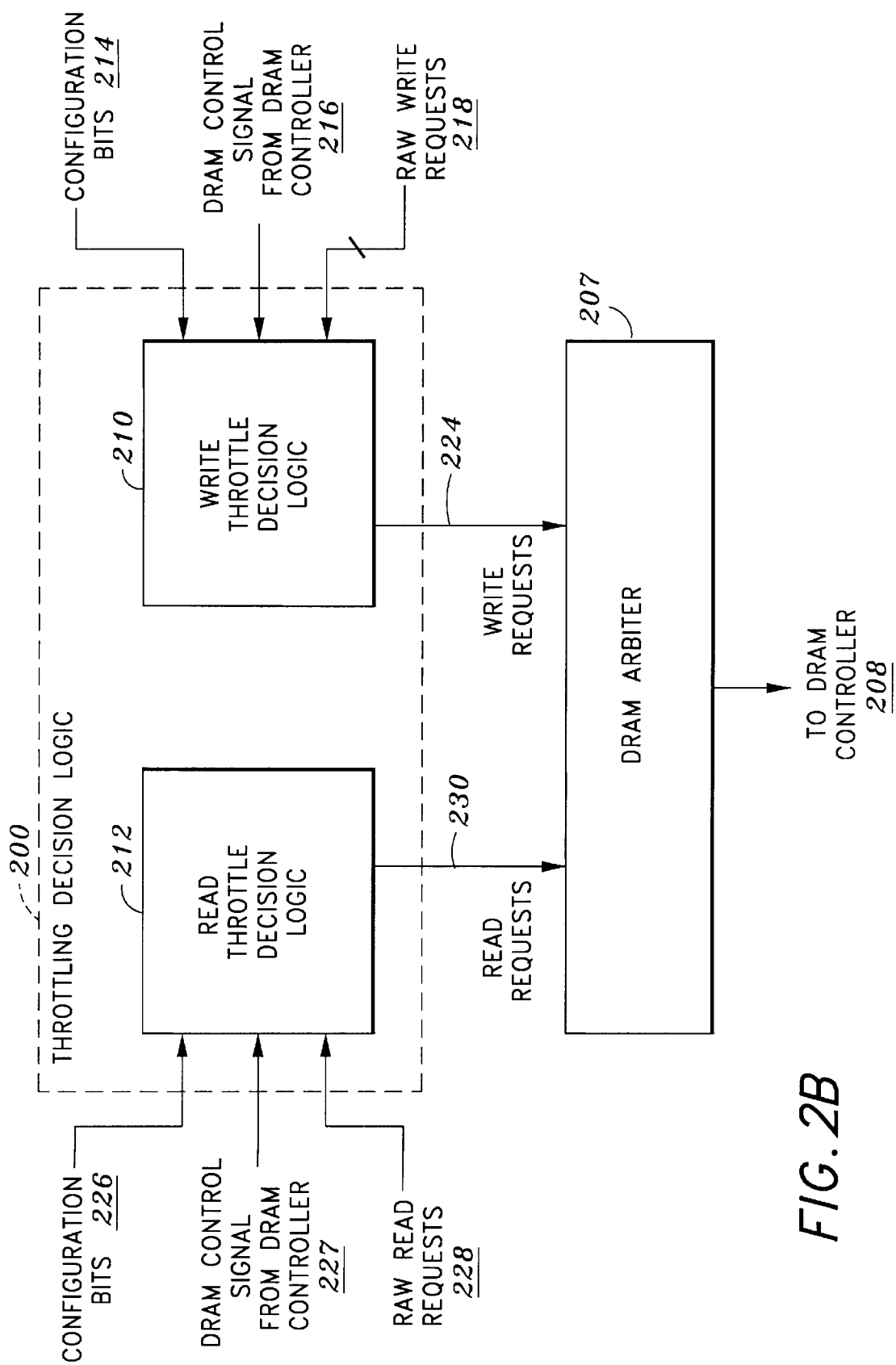
FIG. 2b is a block diagram of one embodiment of a throttling decision logic coupled to a DRAM arbiter of the memory controller.

FIG. 2b is a block diagram of one embodiment of the throttling decision logic coupled to the DRAM arbiter in more detail. Throttling decision logic 200 has a write throttle decision logic 210 and a read throttle decision logic 212.

One or more configuration bits are used by the write throttle decision logic 210 to monitor write requests to the system memory and generate signals to the DRAM arbitor to limit the write requests to be processed when the write access rate has reached a predetermined threshold. Configuration bits 214 are predefined values used to determine whether the write throttle should be enabled. Various registers which are the source of the configuration bits are illustrated in the block diagram of FIG. 3b.

A DRAM control signal 216 from the DRAM controller provides the write throttle decision logic 210 with the number of quad words (QW) written to the system memory. Write requests 218 from the CPU, the AGP device and/or the PCI devices are provided to the write throttle decision logic 210 to be masked and passed on to the DRAM arbiter 207 by the write request line 224 if write throttling is to be enabled. Otherwise, write requests 218 are passed on to the DRAM arbiter 207 without change through the write request line 224.

A DRAM control signal 227 from the DRAM controller provides the number of QW reads made to the system memory to the read throttle decision logic 212. Read requests 228 from the CPU, the AGP device and/or the PCI devices are provided to the read throttle decision logic 212 to be masked if the read throttle is to be enabled. Otherwise, the read requests 218 are forwarded to the DRAM arbiter 207 unchanged through the read request line 230.

Figure 3A:
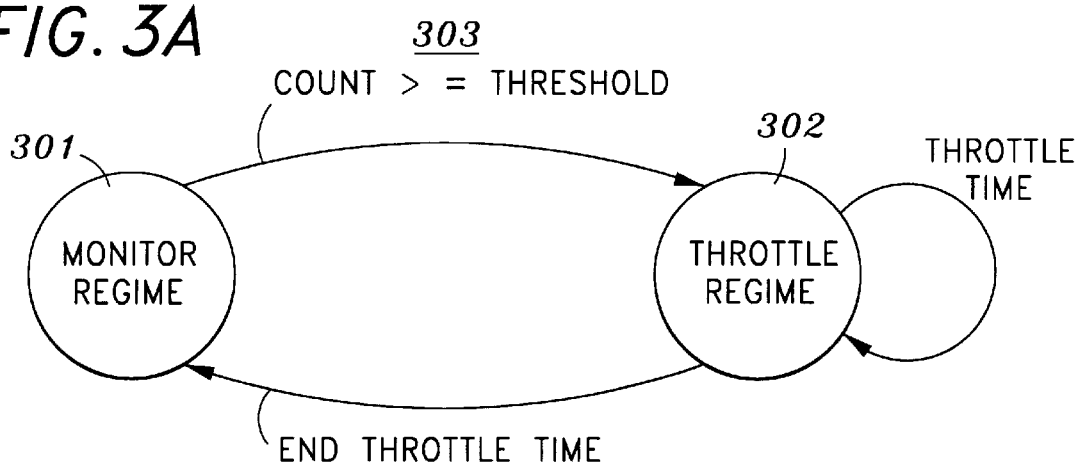
FIG. 3a illustrates the two states of one embodiment of the throttling decision logic.

FIG. 3a illustrates the two regimes of one embodiment of the throttling decision logic. One regime is a monitor regime 301 and the other is a throttle regime 302.

In the monitor regime 301, the throttling decision logic monitors the usage of data access rate to and from the system memory through the memory controller 106. If the access rate crosses certain thresholds, the throttling decision logic enters a throttle regime 302 for a specified period. Otherwise, the throttling decision logic remains in the monitor regime 301.

While in the monitor regime 301, a sampling window is defined during which the access rate to the system memory is monitored. During the sampling window, the accesses to the system memory are counted. At the end of the sampling window, the total number of accesses counted is compared to a defined threshold. For example, given a maximum bandwidth of 800 megabytes per second (MB/s) at which the thermal specification of a memory component is violated, threshold may then be defined as some lower bandwidth such as 500 MB/s. If the counted accesses exceeds the threshold (state transition 303), the function enters the throttle regime 302. Otherwise, a new sampling is used to restart the monitor regime 301.

In the throttle regime 302, the throttling decision logic actively limits the access rate to a defined limit that guarantees that the thermal specification is not violated for the memory controller (i.e. the rated maximum temperature is not exceeded). More specifically, in the throttle regime 302, the throttling decision logic determines that the data access rate must be throttled and sends the DRAM arbiter a mask write or a mask read request to limit the access rate for a defined period of time.

The throttle regime 302 specifies the throttling time. The throttling time may be an integer multiple of a given sampling window. In one embodiment, each throttling time is in the order of seconds and is further divided into throttling windows which are in the order of microseconds (for example ten microseconds). For each throttling window, there is a maximum quad-word (QW) value provided which designates the number of accesses that may be performed. More access requests to system memory are blocked by the DRAM arbiter for the remaining duration of the throttling window. The ratio of access budget to throttling windows effectively controls the access rate to guarantee that the die temperature of the core logic components remains controlled.

Figure 3C:
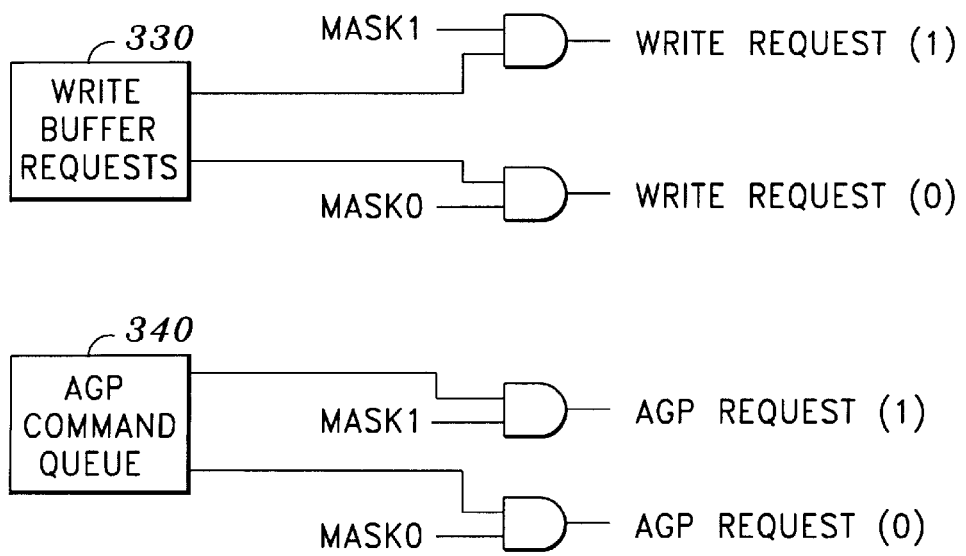
FIG. 3c illustrates the masking of read and write requests.
Figure 3B:
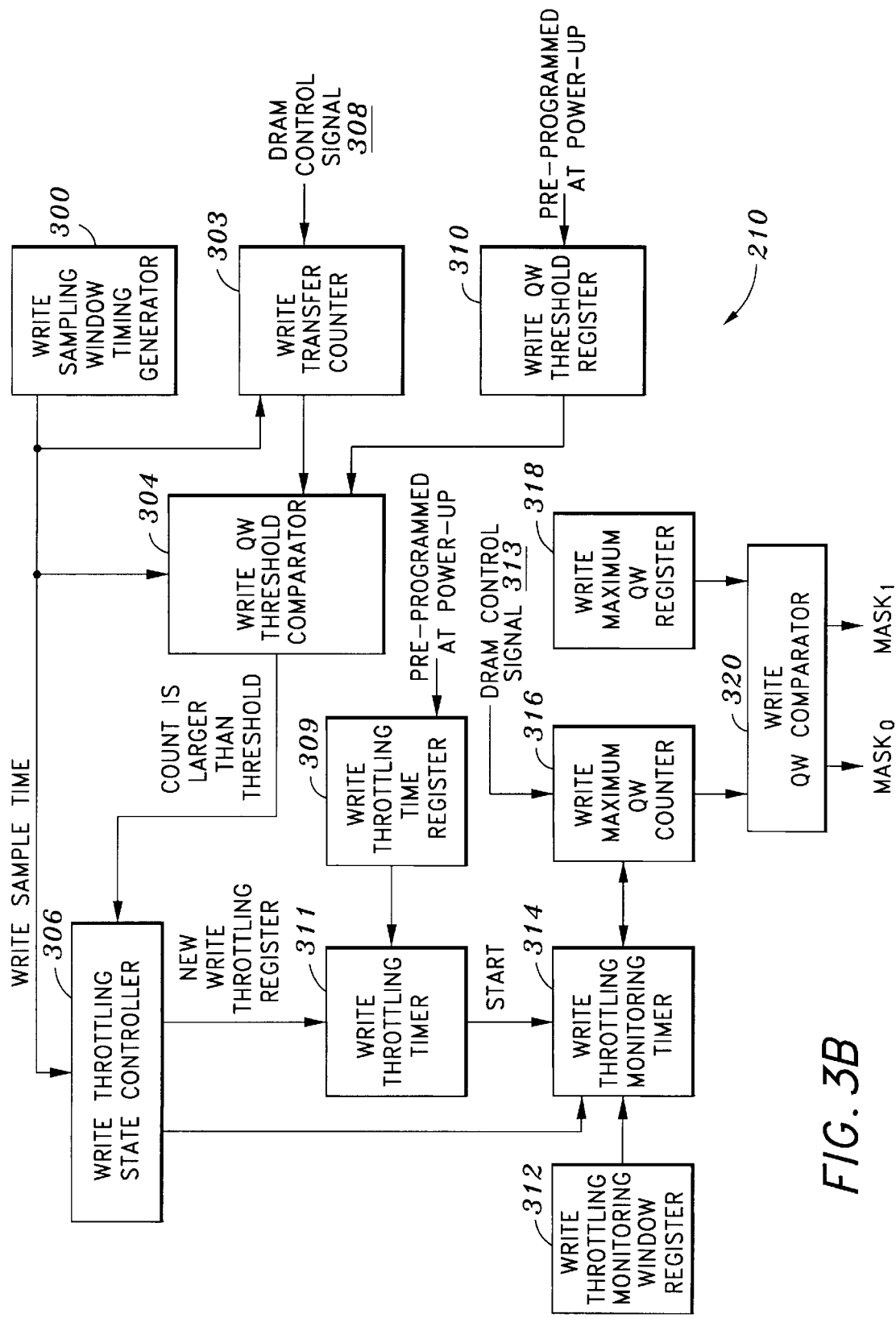
FIG. 3b is a block diagram of one embodiment of the throttling decision logic.

FIG. 3b illustrates one embodiment of the throttling decision logic of the memory controller which generates signals input to the DRAM arbiter to limit the number of data requests to be supported and to limit the duration of the support to prevent thermal violation of the core logic components. Although the block diagram illustrated in FIG. 3b is illustrated for write data requests only, a person skilled in the art may appreciate from the detailed description provided herein that read data requests may also be processed in substantially the same manner as illustrated in the block diagram.

The throttling decision logic remains in the monitor regime until the throttling function is enabled. While in the monitor regime, the write sampling time stored in the write sampling window timing generator and register 300 is fed into a write transfer counter 303, a write quad word (QW) threshold comparator 304 and a write throttling state controller 306.

The write sampling window timing generator and register 300 has a predetermined duration such as one second pre-programmed into the register 300. The duration may be hardwired. The predetermined duration is a time period within which a sampling window samples the number of data requests being made to the system memory through the memory controller 106. More generally, the throttling decision logic monitors the amount of read/write traffic that is generated to the system memory.

The write transfer counter 303 monitors DRAM control signal 308 which indicates the number of data units being transferred to the system memory. In one embodiment, these data units are quad-words (QW). A write QW threshold register 310 is pre-programmed at power up of the computer system by the computer system's boot program (not shown) with a QW threshold of the memory controller. Thus, each time a computer is started or "booted up" using a boot program, a predetermined QW threshold is copied into the write QW threshold register 310 by the boot program. Pre-programming registers using a boot program is well known in the art.

The write QW threshold is selected based on the computer system's bandwidth threshold which guarantees that the memory controller temperature is kept under the specified value. For example, if the sampling window is 1 second and the maximum sustained bandwidth is 500 megabytes (MB) per second, then the desired threshold is 500 divided by 8 which is 62.5 maximum QW per second.

The size of the sampling window is made based on the temperature gradient resulting from the change of bandwidth from some steady state to a maximum bandwidth. For example, if the temperature gradient is 10° C./second, the steady state temperature is 105° C. and the maximum specified temperature is 115° C., then the sampling window is set to 1 second.

At the end of the write sampling window, the write QW threshold comparator 304 compares the number of write data transfers being made as counted by the write transfer counter 303 against the thermal threshold data rate as stored in the write QW threshold register 310. If the number of write data transfer that was counted by the write transfer counter 303 within a write sampling time (as is designated by write sampling window timing generator and register 300) is greater than or equal to the QW threshold data rate given by the write QW threshold register 310, then the write QW threshold comparator 304 signals the write throttling state controller 306 to begin a new write throttle regime. Otherwise, the write throttling logic monitors new write transfers in a monitor regime.

The write throttling state controller 306 then initiates a new write throttle regime and notifies the write throttling timer 311 to access a write throttling time period stored in a write throttling time register 309. The write throttling time period is pre-programmed at power up of the computer system. Further, in one embodiment, the write throttling time is selected in a manner that optimizes the relationship between the throttling factor and the throttling duration.

In general, the longer the throttling time, the lower throttling has to be used. It is desirable for the throttling ratio to be as low as possible to reduce or even minimize its effect on system operation and performance. Further, it is desirable to have the smallest possible throttling time to allow the system to return to the monitor regime and re-assess the need for throttling. Thus, there is a point at which the effect on system operation is minimal but yet the throttling time is small enough to provide sufficient granularity for monitoring the traffic to the system memory.

For example, let K be the ratio between the sampling window and throttling time and let T.BW be the allowed bandwidth during a throttle regime. Further, assume that the required sustained bandwidth is 500 megabytes per second (MB/S), and assume a maximum bandwidth of 800 MB/S when a throttling threshold is exceeded. With the given quantities, the following equation is maintained:

$$500 \text{MB/S} = \frac{T.BW \times K + 800 \text{MB/S}}{K+1}$$

or:

$$T.BW = \frac{500(K+1) - 800}{K} \quad \text{where}$$

$$K = 1 \quad T.BW = 200 \text{MB/S}$$
$$K = 2 \quad T.BW = 350 \text{MB/S}$$
$$K = 3 \quad T.BW = 400 \text{MB/S}$$
$$\vdots$$
$$K = 63 \text{(maximum)} \quad T.BW \approx 500 \text{MB/S}$$

To achieve a given average bandwidth that guarantees the desired component temperature, throttling may be performed deeper for a short time or less deeply for a longer time. As was illustrated above, assuming that the maximum bandwidth is 800 MB/second and the desired sustained bandwidth is 500 MB/second. If the sampling period is set to 1 second, the desired sustained bandwidth may be achieved by throttling for a period of 1 second down to 200 MB/second or throttle for 2 seconds (K=2) at 350 MB/second (T.BW=350 MB/S).

Once the write throttling state controller 306 initiates a new write throttling regime, a write throttling monitoring timer 314 is signaled by the write throttling state controller 306 and the write throttling timer 311 to begin a new write throttling monitoring time. The write throttling monitoring timer 314 begins counting the time period designated by a write throttling monitoring window register 312. Thus, both the write throttling timer 311 and the write throttling monitoring timer 314 begin counting a pre-determined time period. Hence, in one embodiment, for each one unit of write throttling timer 314, there are multiple write throttling monitoring windows. For example, for every one second of a write throttling monitoring time, there may be multiple write throttling monitoring windows with a duration of ten microseconds each.

The present invention's throttling is based on limiting the amount of data transfers allowed to be performed during a given time period. If a budget of transfers is allocated to a throttling time of typically one or more seconds, the transfers may have to be masked for a time duration of portions of a second or more. Long delays (or latency) in executing cycles cause certain system operation failures. For example, operating systems are sensitive to such long delays as it attempts to measure time in sub-second units. In one embodiment, the operating system typically measures time eighteen times in a second, or once every 55 microseconds. The present invention allocates smaller budgets to a smaller time unit in such an order (for example, in the order of micro-seconds) that basic system operation will not be impacted.

A write maximum QW counter 316 receives the DRAM control signal 313 that designates the number of write data transfers occurring during each write throttling monitoring window. A write maximum QW register 318 contains a maximum unit of write data transfer (quad word) which is compared to the accumulated write data transfer as counted by the write maximum counter 316. If the accumulated maximum QW as counted by the write maximum QW counter 316 is greater than or equal to the write maximum QW stored in the write maximum QW register 318, then a write maximum QW comparator 320 outputs a write mask control to the DRAM arbiter.

In one embodiment, for each and every write throttle monitoring window, a budget of a write maximum QW is allocated to be performed. If more write requests are introduced within the same write throttling monitoring window, the write requests are blocked by the DRAM arbiter and will not be executed until the end of the current write throttling monitoring window.

The write maximum QW is selected in accordance with the throttle monitoring window and based on the bandwidth desired while throttling. For example, if the throttle window is selected to be 10 micro-seconds and the desired throttle bandwidth is 350 MB/second, then the selected write maximum QW is approximately 437 quad words (QW).

As mentioned earlier, the read data transfers are processed in the same manner as the write data transfers. More specifically, a read sampling window is a time period during which a read transfer counter monitors the amount of read traffic that is generated to the system memory. The read sampling window is associated with the monitor regime. At the end of the read sampling window, the accumulated number of QW reads from the system memory is compared to a predetermined read QW threshold.

If the accumulated number of QW is greater than the read QW threshold, then there is a need to throttle the read requests and the throttle regime is entered. Otherwise, the present invention will again monitor read requests.

Once there is a need to throttle read requests, the DRAM controller enters the throttle regime. The DRAM controller will remain in the throttle regime for a duration of a predetermined read throttling time stored in a read throttling time register. In one embodiment, the throttle regime is further divided into a plurality of read throttle monitoring windows. For example, if a read throttling time is a few seconds, the read throttle monitoring window may be set to ten microseconds.

Finally, for each and every read throttling monitoring window, the present invention allocates a budget of read maximum QW to be performed. If more read requests are introduced in the same read throttling monitoring window, the requests are blocked by the DRAM arbiter and will not be executed until the end of the current read throttle monitoring window.

FIG. 3c illustrates the masking of read and write requests performed in the throttling decision logic prior to the masked requests being input to the DRAM arbiter. Write buffer request 330 is fed into two AND gates along with a mask one (1) for masking pending write buffer requests and mask zero (0) for masking current write buffer requests. An input of one is made for the respective masks when throttling is disabled and an input of zero is made for the respective masks when throttling is enabled. The respective write requests are then passed on to the DRAM arbiter. Similarly, given an AGP command queue 340, the inputs are provided to AND gates which also accept a mask one (1) for pending AGP command queue requests and mask zero (0) for current AGP command queue requests. The respective AGP requests are then forwarded to the DRAM arbiter. Other masking schemes may be employed and would be apparent to those skilled in the art.

Figure 4A:
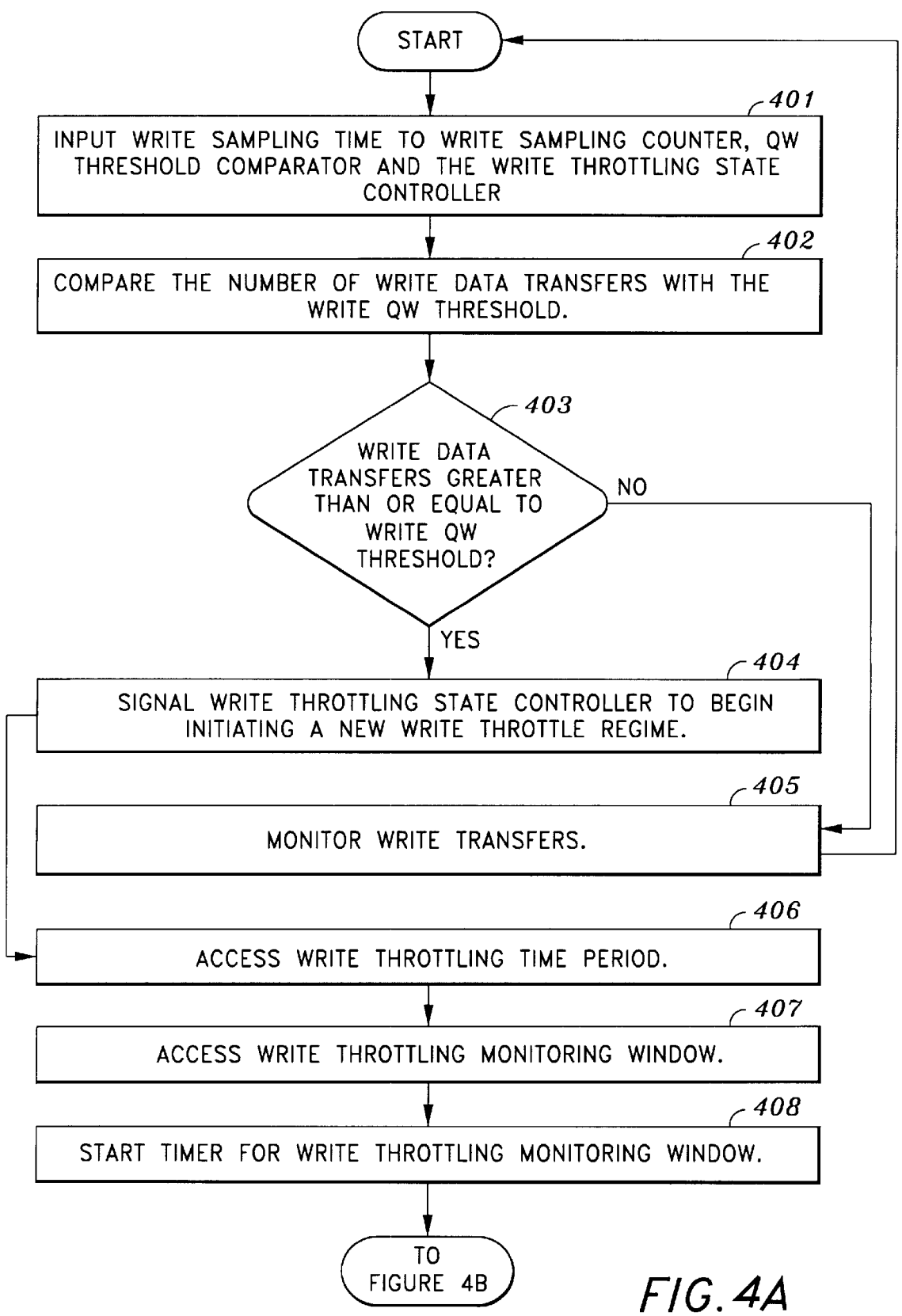
FIGS. 4a and 4b are flow diagrams illustrating the general steps followed by one embodiment of the present invention for controlling core logic temperature.
Figure 4B:
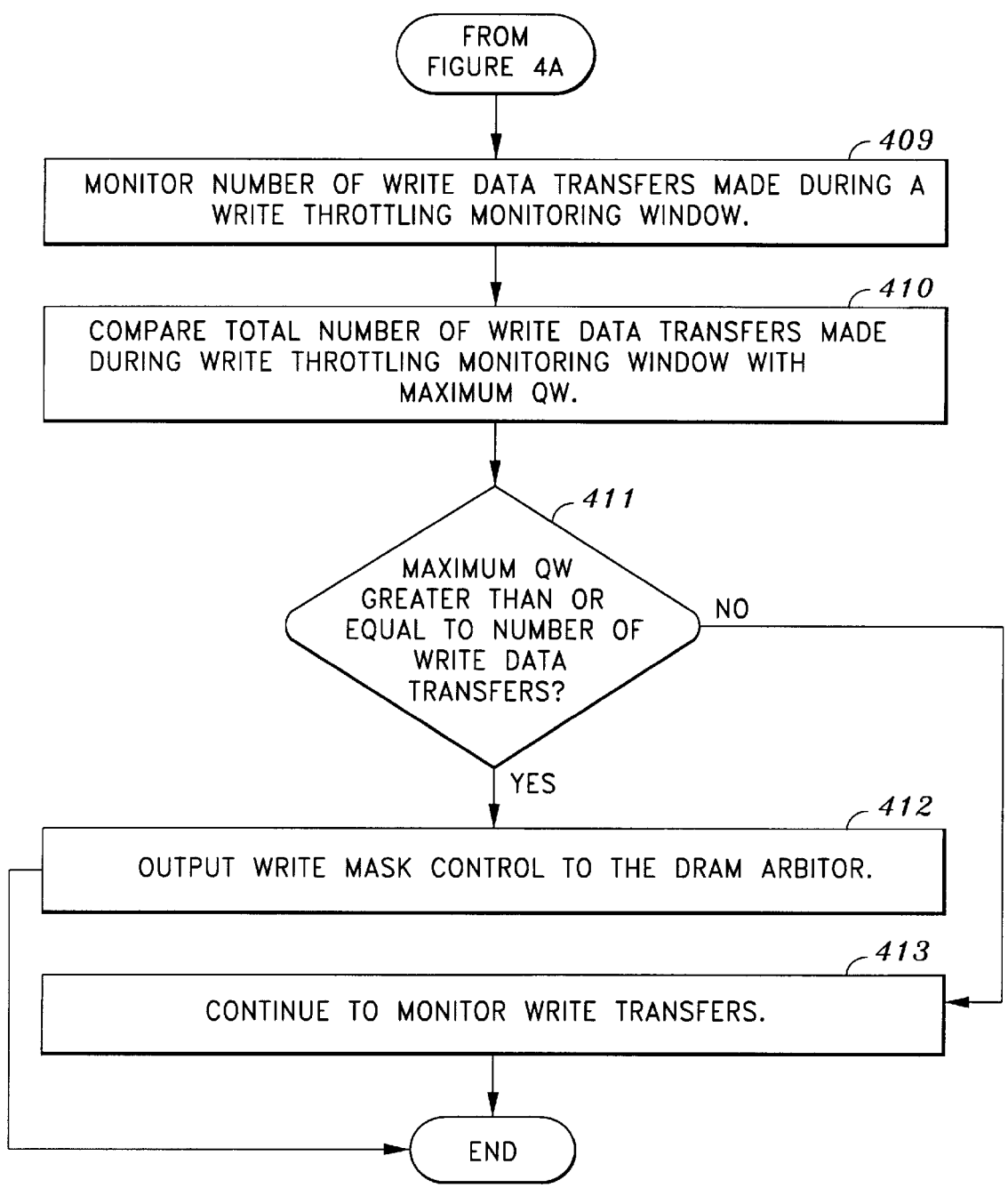

FIGS. 4a and 4b are flow diagrams illustrating the general steps followed by one embodiment of the present invention. The flow diagrams illustrated in FIGS. 4a and 4b are illustrated for write data requests; however, read data requests may also be processed in the same manner as illustrated in the flow diagrams.

In step 401, the write sampling time stored in the write sampling window timing generator and register 300 is fed into a write transfer counter 302, a write quad word (QW) threshold comparator 304 and a write throttling state controller 306. The write transfer counter 302 counts the number of write requests being supported by the memory controller during the write sampling window.

In step 402, at the end of the write sampling window, the write QW threshold comparator 304 compares the number of write data transfers that are counted by the write transfer counter 302 against the thermal threshold data rate as stored in a write QW threshold register 310. In step 403, if the number of write data transfer that is counted by the write transfer counter 302 during the write sampling window is greater than or equal to the QW threshold given by the write QW threshold register 310, then in step 404, the write QW threshold comparator 304 signals the write throttling state controller 306 to initiate a new write throttle regime. Otherwise, in step 405, the write throttling decision logic will again monitor write transfers.

In step 406, the write throttling state controller 306 enters a new write throttle regime and notifies the write throttling timer 311 to access a write throttling time period stored in a write throttling time register 309. In step 407, the write throttling monitoring timer 314 is signaled by the write throttling state controller 306 and the write throttling timer 311 to access a write throttling monitoring time from a write throttling monitoring window register 312. In step 408, the write throttling monitoring timer 314 begins counting the time period designated by the write throttling monitoring window register 312.

In step 409, the write maximum QW counter 316 receives the DRAM control signal 313 that designates the number of write data transfers occurring during each write throttling monitoring widow. In step 410 the maximum unit of data write transfer in a write maximum QW register 318 is compared to the accumulated write data transfer as counted by a write maximum QW counter 316. In step 411, if the accumulated maximum QW as counted by the write maximum QW counter 316 is greater than or equal to the write maximum QW stored in the write maximum QW register 318, then in step 412 a write maximum QW comparator 320 outputs a write mask control to mask the write requests to the DRAM arbiter. Otherwise, in step 413 the throttling decision logic will again monitor the write transfers.

What has been described is a method and apparatus to control core logic temperature to prevent thermal violations of the core logic. The write access rate provides control of the memory controller thermal conditions while the read access rate provides control of the DRAM components. Thus, the present invention provides independent monitor and control of read and write access rates. For example, when write throttling conditions are met as determined by the write throttling decision logic, the present invention blocks writes but attempts to service read requests for as long as the read throttling function is not enabled.

While certain exemplary embodiments have been described in detail and shown in the accompanying drawings, it is to be understood that such embodiments are merely illustrative of and not restrictive on the broad invention, and that this invention is not to be limited to the specific arrangements and constructions shown and described, since various other modifications may occur to those with ordinary skill in the art.

What is claimed is:

1. A method comprising:
   determining access rate to a component;
   adjusting said access rate for to control temperature of the component, said adjusting comprising;
   counting a number of data transfer requests made to a system memory, and
   pre-programming a sampling window during which the number of data transfer requests is counted; and
   pre-programming a data threshold which is an amount of data which can be transferred before a potential thermal violation of the component occurs.

2. The method of claim 1 wherein said component is a memory device.

3. The method of claim 1 wherein said component is a memory controller.

4. The method of claim 1 wherein said component is a data source.

5. The method of claim 1 further comprising comparing said number of data transfer requests with said data threshold.

6. The method of claim 1 further comprising initiating throttling of data transfer requests if said number of data transfer requests is greater than or equal to said data threshold.

7. The method of claim 6 further comprising pre-programming a throttle time period during which the number of data transfer requests is monitored while throttling.

8. The method of claim 7 wherein the throttle time period comprises a throttling monitoring window.

9. The method of claim 8 wherein said throttling monitor window monitors the number of data transfers made.

10. The method of claim 9 further comprising pre-programming a value which designates the maximum number of data transfers allowed to be processed before a potential thermal violation occurs.

11. The method of claim 10 further comprising comparing said number of data transfers made during said throttling monitoring window with said value.

12. The method of claim 11 further comprising generating a mask control signal to mask a next data transfer request.

13. The method of claim 10 wherein said value is a maximum data value.

14. An apparatus comprising:
a controller to generate a control signal indicative of an access rate to a component; and
a throttling logic coupled to the controller to generate a mask signal to adjust the access rate, the adjusted access rate controlling temperature of the component.

15. The apparatus of claim 14 wherein the throttling logic generates a mask signal when the temperature crosses over a predetermined thermal specification.

16. The apparatus of claim 14 further comprising a plurality of data transfer request queues coupled to said throttling logic, said plurality of data transfer queues configured to hold data transfer requests generated by a device.

17. The apparatus of claim 16 wherein said device comprises a central processing unit.

18. The apparatus of claim 16 wherein said device comprises an accelerated graphics port.

19. The apparatus of claim 16 wherein said device comprises a peripheral component interconnect device.

20. The apparatus of claim 14 wherein said throttling logic further comprises a read throttle logic configured to generate a read mask signal to mask read data transfer requests to the component prior to the temperature of the component crossing over a predetermined thermal specification.

21. The apparatus of claim 14 wherein said throttling logic further comprises a write throttle logic configured to generate a write mask signal to mask write data transfer requests to the component prior to the temperature of the component crossing over a predetermined thermal specification.

22. The apparatus of claim 14 further comprising a sampling window timing generator configured to generate a sampling window which designates a time duration during which the number of data transfer requests processed is counted by monitoring said control signals designating processed data transfer requests.

23. The apparatus of claim 22 further comprising a transfer counter coupled to said sampling window timing generator, said transfer counter configured to monitor said control signal to determine the number of data transfer requests processed during said sampling window.

24. The apparatus of claim 23 further comprising a data unit threshold comparator coupled to said sampling window timing generator and said transfer counter, said data unit threshold comparator configured to compare said number of data requests processed during said sampling window to a data unit threshold.

25. The apparatus of claim 24 further comprising a data unit threshold register coupled to said data unit threshold comparator, said data unit threshold register configured to hold said data unit threshold.

26. The apparatus of claim 25 further comprising a throttling state controller coupled to said sampling window timing generator and said data unit threshold comparator, said throttling state controller configured to initiate a throttle regime if said data unit threshold comparator determines that said number of data requests processed during said sampling window is greater than or equal to said data unit threshold.

27. The apparatus of claim 26 further comprising a throttling timer coupled to said throttling state controller, said throttling timer configured to count a throttling time period during which a predetermined maximum number of data transfer requests in data units are allowed to be processed through the component.

28. The apparatus of claim 27 further comprising a throttling time register coupled to said throttling timer, said throttling time register configured to hold a value designating said maximum number of data transfer requests in data units allowed to be processed through the component during said throttling time period.

29. The apparatus of claim 28 further comprising a throttling monitoring timer coupled to said throttling timer, said throttling monitoring timer configured to count a throttling monitoring window time period which is a sub-unit of said throttling time period.

30. The apparatus of claim 29 further comprising a throttling monitoring window register coupled to said throttling monitoring timer, said throttling monitoring window configured to hold said throttling monitoring window time period.

31. The apparatus of claim 30 further comprising a maximum data unit counter coupled to said throttling monitoring timer, said maximum data unit counter configured to receive said control signal designating said data transfer requests processed and count the number of said data transfer requests processed during each said throttling monitoring window of said throttling time.

32. The apparatus of claim 31 further comprising a data unit comparator coupled to said maximum data unit counter, said data unit comparator configured to compare said number of data transfer requests processed during each said throttling monitoring window of said throttling time to a maximum data unit value, said data unit comparator generating a mask control signal if said number of data transfer requests processed is greater than or equal to said maximum data unit value.

33. The apparatus of claim 32 further comprising a maximum data unit register coupled to said data unit comparator, said maximum data unit register configured to hold said maximum data unit value.

34. An apparatus comprising:
a controller configured to monitor access request to a component, the controller generating a control signal;
a throttling logic coupled to the controller to generate a mask signal from the control signal; and
an arbiter coupled to the throttling logic to mask the access request using the mask signal.

35. A system comprising:
a destination configured to accept data transfer requests from a source; and
a controller coupled to said source, said controller configured to control temperature of said destination based on number of said data transfer requests made from said source to said destination to process said data transfer requests.

36. The system of claim 35 wherein said controller further comprises a throttling logic configured to generate a mask control signal to mask data transfer requests to said destination prior to the temperature of the system crossing over a predetermined thermal specification.

37. The system of claim 36 wherein said controller is configured to generate control signals to said throttling logic designating processed data transfer requests.

38. The system of claim 37 further comprising a plurality of data transfer request queues coupled to said throttling decision logic, said plurality of data transfer queues configured to hold data transfer requests generated by said source.

39. The system of claim 38 wherein said source comprises a central processing unit.

40. The system of claim 38 wherein said source comprises an accelerated graphics port.

41. The system of claim 38 wherein said source comprises a peripheral component interconnect device.

42. The system of claim 38 wherein said throttling logic further comprises a read throttle logic configured to generate a mask control signal to mask read data transfer requests to said destination prior to the temperature of said controller crossing over a predetermined thermal specification.

43. The system of claim 42 wherein said throttling decision logic further comprises a write throttle logic configured to generate a mask control signal to mask write data transfer requests to said destination prior to the temperature of said controller crossing over a predetermined thermal specification.

44. The system of claim 43 further comprising a sampling window timing generator configured to generate a sampling window which designates a time duration during which the number of data transfer requests processed is counted by monitoring said control signals designating processed data transfer requests.

45. The system of claim 44 further comprising a transfer counter coupled to said sampling window timing generator, said transfer counter configured to monitor said control signal to determine the number of data transfer requests processed during said sampling window.

46. The system of claim 45 further comprising a data unit threshold comparator coupled to said sampling window timing generator and said transfer counter, said data unit threshold comparator configured to compare said number of data requests processed during said sampling window to a data unit threshold.

47. The system of claim 46 further comprising a data unit threshold register coupled to said data unit threshold comparator, said data unit threshold register configured to hold said data unit threshold.

48. The system of claim 47 further comprising a throttling state controller coupled to said sampling window timing generator and said data unit threshold comparator, said throttling state controller configured to initiate a throttle regime if said data unit threshold comparator determines that said number of data requests processed during said sampling window is greater than or equal to said data unit threshold.

49. The system of claim 48 further comprising a throttling timer coupled to said throttling state controller, said throttling timer configured to count a throttling time period during which a predetermined maximum number of data transfer requests in data units are allowed to be processed through said controller.

50. The system of claim 49 further comprising a throttling time register coupled to said throttling timer, said throttling time register configured to hold a value designating said maximum number of data transfer requests in data units allowed to be processed through said controller during said throttling time period.

51. The system of claim 50 further comprising a throttling monitoring timer coupled to said throttling timer, said throttling monitoring timer configured to count a throttling monitoring window time period which is a sub-unit of said throttling time period.

52. The system of claim 51 further comprising a throttling monitoring window register coupled to said throttling monitoring timer, said throttling monitoring window configured to hold said throttling monitoring window time period.

53. The system of claim 52 further comprising a maximum data unit counter coupled to said throttling monitoring timer, said maximum data unit counter configured to receive said control signal designating said data transfer requests processed and count the number of said data transfer requests processed during each said throttling monitoring window of said throttling time.

54. The system of claim 53 further comprising a data unit comparator coupled to said maximum data unit counter, said data unit comparator configured to compare said number of data transfer requests processed during each said throttling monitoring window of said throttling time to a maximum data unit value, said data unit comparator generating a mask control signal if said number of data transfer requests processed is greater than or equal to said maximum data unit value.

55. The system of claim 54 further comprising a maximum data unit register coupled to said data unit comparator, said maximum data unit register configured to hold said maximum data unit value.

56. The apparatus of claim 34 wherein the control signal notifies the throttling logic of number of access requests processed by the controller.

57. The apparatus of claim 56 wherein the throttling logic throttles access request if the number of processed access requests is equal to or greater than a predetermined threshold.

58. The apparatus of claim 34 wherein the component is one of a central control unit, an accelerated graphics port, and a peripheral component interconnect device.

* * * * *